United States Patent
Horng et al.

(10) Patent No.: US 8,648,611 B2
(45) Date of Patent: Feb. 11, 2014

(54) RF SENSING CIRCUIT WITH A VOLTAGE-CONTROLLED OSCILLATOR

(75) Inventors: Tzyy-Sheng Horng, Kaohsiung (TW); Chien-Jung Li, Xuejia Township, Tainan County (TW); Kang-Chun Peng, Kaohsiung (TW); Fu-Kang Wang, Kaohsiung (TW)

(73) Assignees: Industrial Technology Research Institute, Chutung, Hsinchu (TW); National Sun Yat-Sen University, Kaohsiung (TW)

( * ) Notice: Subject to any disclaimer, the term of this patent is extended or adjusted under 35 U.S.C. 154(b) by 978 days.

(21) Appl. No.: 12/757,249

(22) Filed: Apr. 9, 2010

(65) Prior Publication Data

US 2010/0283513 A1    Nov. 11, 2010

(30) Foreign Application Priority Data

May 5, 2009   (TW) .................. 98114914 A

(51) Int. Cl.
*G01R 27/04*    (2006.01)
(52) U.S. Cl.
USPC ............ 324/629; 327/105; 455/312; 455/209
(58) Field of Classification Search
USPC ............... 324/629, 633, 76.11; 455/209, 312; 327/105
See application file for complete search history.

(56) References Cited

U.S. PATENT DOCUMENTS

| | | | |
|---|---|---|---|
| 5,305,007 A | 4/1994 | Orr et al. | |
| 5,832,027 A * | 11/1998 | Ishigaki | 375/149 |
| 6,400,305 B1 | 6/2002 | Kuhn | |
| 6,507,308 B1 | 1/2003 | Ono et al. | |
| 6,617,995 B2 | 9/2003 | Kim et al. | |
| 6,675,003 B1 * | 1/2004 | Dubash et al. | 455/302 |
| 6,731,101 B2 * | 5/2004 | Miyagawa et al. | 324/76.79 |
| 6,961,547 B2 * | 11/2005 | Rozenblit et al. | 455/118 |
| 2001/0026597 A1 * | 10/2001 | Komiyama | 375/316 |
| 2005/0080564 A1 * | 4/2005 | Tso et al. | 701/214 |
| 2008/0119157 A1 * | 5/2008 | Watanabe | 455/302 |
| 2011/0003571 A1 * | 1/2011 | Park et al. | 455/258 |

FOREIGN PATENT DOCUMENTS

TW    I291809 B    12/2007
TW    I304295 B    12/2008

OTHER PUBLICATIONS

Taiwan Office Action for the counterpart application, Jul. 30, 2012.
Matos, J.; Gameiro, A.; Perez, J.; "Improved acquisition and tracking performace of PLLs through signal injection," Circuits and Systems, 1995., Proceedings, Proceedings of the 38th Midwest Symposium on, vol. 2, no., pp. 1244-1247 vol. 2, Aug. 13-16, 1995.

* cited by examiner

*Primary Examiner* — Arleen M Vazquez
(74) *Attorney, Agent, or Firm* — Egbert Law Offices, PLLC

(57) ABSTRACT

An RF sensing circuit with a voltage-controlled oscillator comprises a low noise amplifier (LNA), a voltage-controlled oscillator (VCO), a frequency demodulating unit, a bandpass filter (BPF) and a digital signal processing unit. The VCO has an injection signal input port and a voltage input port, wherein the injection signal input port is electrically connected with an output of the LNA. The frequency demodulating unit is electrically connected with an output of the VCO and the BPF is electrically connected with an output of the frequency demodulating unit. The digital signal processing unit is electrically connected with an output of the BPF and the voltage input port of the VCO.

7 Claims, 6 Drawing Sheets

RF SENSING CIRCUIT WITH A VOLTAGE-CONTROLLED OSCILLATOR

CROSS-REFERENCE TO RELATED APPLICATIONS

Not applicable.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The disclosure relates to a radio frequency (RF) sensing circuit, and more specifically, to an RF sensing circuit having a voltage-controlled oscillator.

2. Description of Related Art Including Information Disclosed Under 37 CFR 1.97 and 37 CFR 1.98.

Current RF sensing circuits may be classified into two types including an independent power detector and an architecture using a traditional RF receiver associated with a digital signal processor. For an independent power detector, a circuit sensing signal power is formed at the front end of the RF. This architecture is simple but is not sensitive, and requires serial connection of multiple amplifiers to satisfy the system requirement. In such an arrangement, signals are easily obscured by noises. Hence, this architecture is restricted to certain applications. For the architecture using a traditional RF receiver associated with a digital signal processor, a heterodyne-type reception portion (including a low noise amplifier, a first mixer, a first intermediate frequency amplifier, a second mixer, a second intermediate frequency amplifier and two sets of frequency synthesizers) at the second intermediate frequency end verifies noises and signals by an analog-to-digital converter and the digital signal processor to sense the presence of sensing signals. For an RF sensing circuit, the base band end and the reference signal embedded in the digital signal processor are compared to judge the presence of the signals. Although the sensitivity of such sensing circuit can meet the system requirement, the sensing circuit is complex and has high power consumption, and the circuit dimensions are not easily decreased. Moreover, the architecture is generally restricted by the switching timing of the frequency synthesizer of the reception portion and it is not easily possible to increase the frequency spectrum scanning speed of the sensing circuit. Hence, this architecture needs a high sampling rate analog-to-digital converter and a high-speed and high-capacity digital signal processor to perform complex sampling, calculation and comparison, and thus the cost is relatively high.

BRIEF SUMMARY OF THE INVENTION

The disclosure provides an exemplary embodiment of RF sensing circuit with a voltage-controlled oscillator including a low noise amplifier (LNA), a voltage-controlled oscillator (VCO), a non-synchronizing frequency demodulating unit, a band pass filter (BPF) and a digital signal processing unit. The voltage-controlled oscillator has an injection signal input port and a voltage input port. The injection signal input port is electrically connected to an output of the low noise amplifier. The non-synchronizing frequency demodulating unit is electrically connected to an output of the voltage-controlled oscillator. The band pass filter is electrically connected to the output of the non-synchronizing frequency demodulating unit. The digital signal processing unit is electrically connected to the output of the band pass filter and the voltage input port of the voltage-controlled oscillator. The RF sensing circuit of the disclosure using injection locking and frequency demodulation as sensing bases can reduce the use of circuit devices, system complexity, and power consumption. In accordance with the disclosure, sensing sensitivity can be increased by introducing a low noise amplifier and injection locking. Because the frequency synthesizer is not used for the disclosure, it is not restricted to the switching time, and frequency spectrum scanning speed can be increased significantly.

DETAILED DESCRIPTION OF THE INVENTION

The embodiments will be explained with the appended drawings to clearly disclose the technical characteristics of the disclosure.

Figure 1:
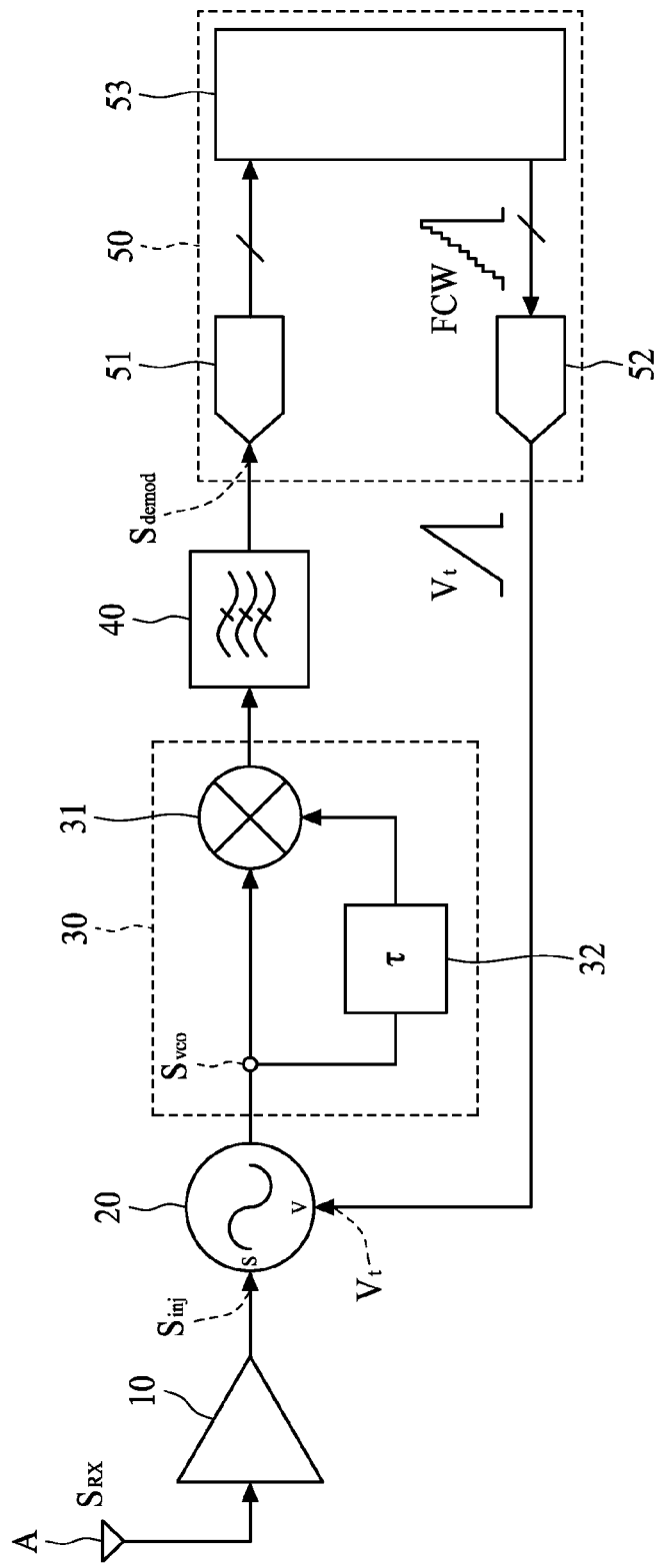
FIG. 1 shows a schematic view of an RF sensing circuit with a voltage-controlled oscillator in accordance with an embodiment of the disclosure.

FIG. 1 shows an embodiment of the disclosure. An RF sensing circuit with a voltage-controlled oscillator is configured to sense a RF modulating signal $S_{RX}$. The RF sensing circuit includes a receiving antenna A, a low noise amplifier 10, a voltage-controlled oscillator 20, a non-synchronizing frequency demodulating unit 30, a band pass filter 40 and a digital signal processing unit 50. The receiving antenna A is electrically connected to an input of the low noise amplifier 10. The receiving antenna A receives the RF modulating signal $S_{RX}$, and transmits the RF modulating signal $S_{RX}$ to the low noise amplifier 10. The low noise amplifier 10 amplifies the RF modulating signal $S_{RX}$ to $S_{inj}$. The voltage-controlled oscillator 20 has an injection signal input port "s" and a voltage input port "v." In this embodiment, the injection signal input port "s" is electrically connected to the output of the low noise amplifier 10. The amplified signal $S_{inj}$ is input to the voltage-controlled oscillator 20 through the injection signal input port "s." The non-synchronizing frequency demodulating unit 30 is electrically connected to an output of the voltage-controlled oscillator 20, so as to monitor the frequency spectrum variation output from the voltage-controlled oscillator 20. The non-synchronizing frequency demodulating unit 30 includes a mixer 31 and a delay line 32. In this embodiment, the mixer 31 is electrically connected to an output of the voltage-controlled oscillator 20, and two ends of the delay line 32 are electrically connected to the mixer 31 and the output of the voltage-controlled oscillator 20. The band pass filter 40 is electrically connected to the output of the non-synchronizing frequency demodulating unit 30. In this embodiment, the output of the non-synchronizing frequency demodulating unit 30 is the output of the mixer 31. Referring to FIG. 1, the digital signal processing unit 50 is electrically connected to the output of the band pass filter 40 and the voltage input port "v" of the voltage-controlled oscillator 20. In this embodiment, the digital signal processing unit 50 includes an analog-to-digital converter 51, a digital-to-analog converter 52 and a digital signal processor 53. The analog-to-digital converter 51 is electrically connected to the output of the band pass filter 40. The digital-to-analog converter 52 is electrically connected to the voltage input port "v" of the voltage-controlled oscillator 20. The digital signal processor 53 is electrically connected to the analog-to-digital converter 51 and the digital-to-analog converter 52. The digital signal processor 53 can output a frequency control signal FCW to the digital-to-analog converter 52, so as to generate an analog scanning voltage $V_t$, and the analog scanning voltage $V_t$ can adjust the output frequency of the voltage-controlled oscillator 20 so as to complete frequency spectrum scanning within the operating band. Moreover, in this embodiment, the output frequency $S_{vco}$ of the voltage-controlled oscillator 20 goes through the non-synchronizing frequency demodulating unit 30 and the band pass filter 40 to generate a narrow band analog signal $S_{demod}$. The analog-to-digital converter 51 samples the narrow band analog signal $S_{demod}$. Next, the digital signal processor 53 performs frequency positioning of the sensing signal and determines the power to find out any signal activity of the frequency spectrum.

Figure 2A:
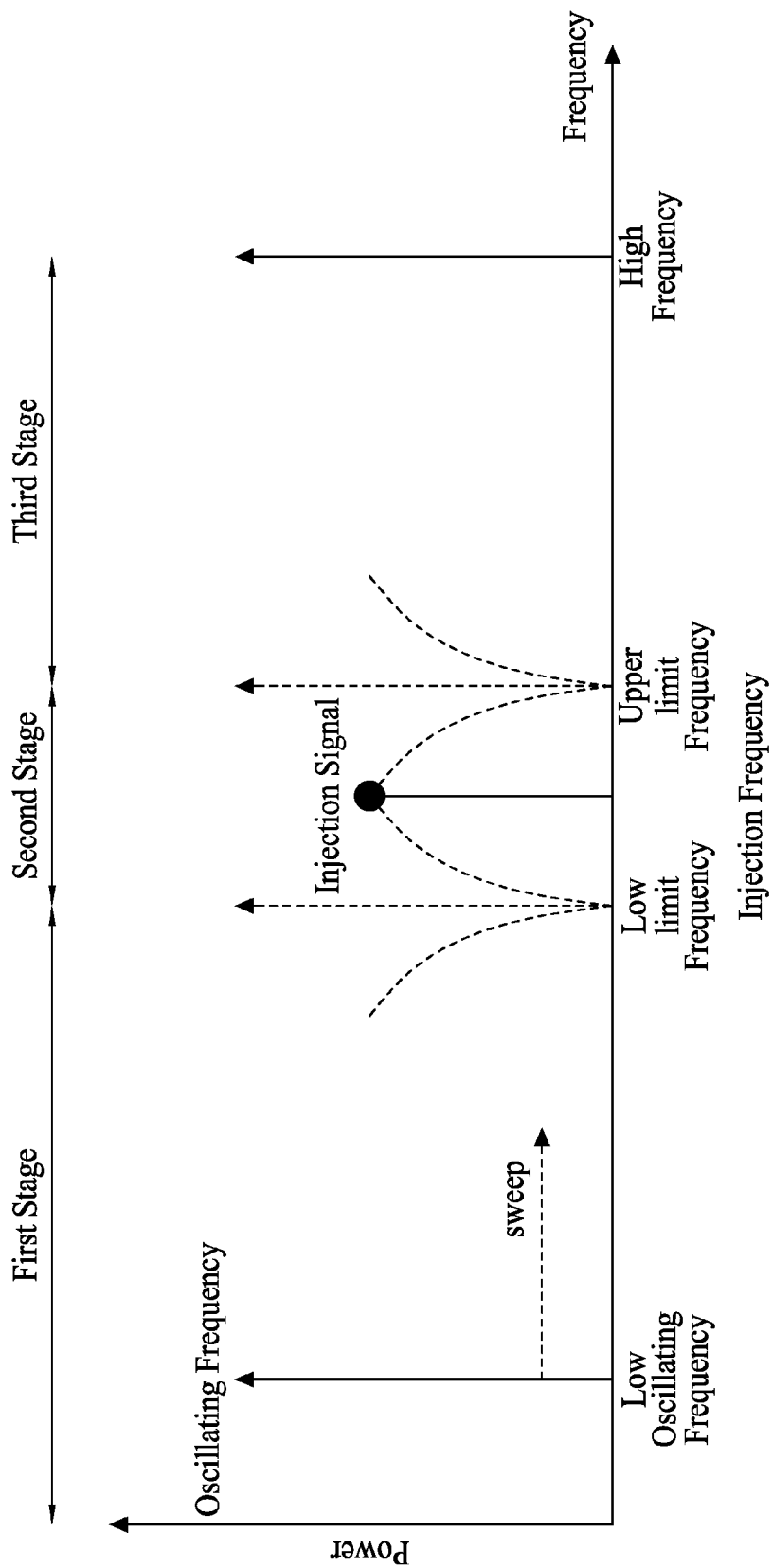
FIG. 2A is a graphical view of a frequency scanning diagram of an RF sensing circuit in accordance with an embodiment of the disclosure.
Figure 2B:
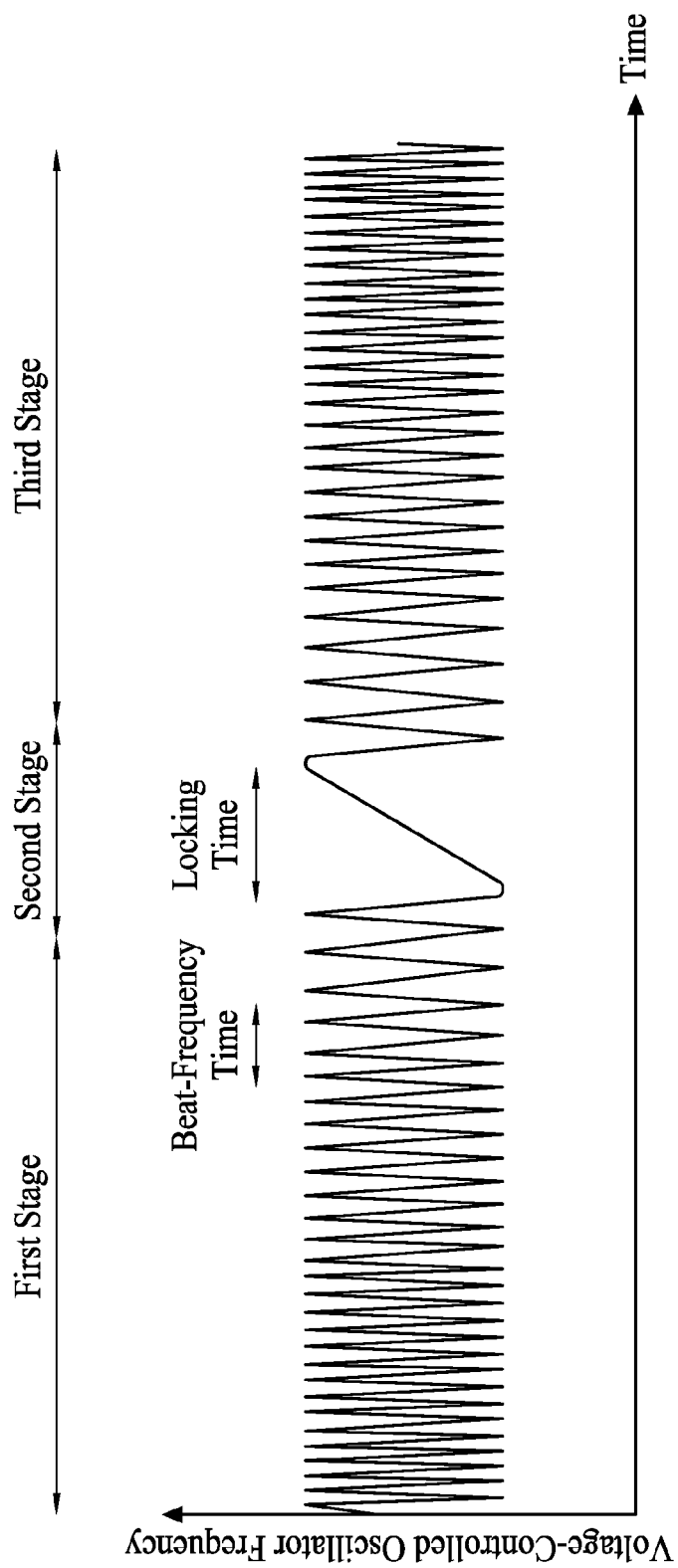
FIG. 2B is a graphical view of an output frequency of a voltage-controlled oscillator vs. time diagram during frequency scanning.
Figure 2C:
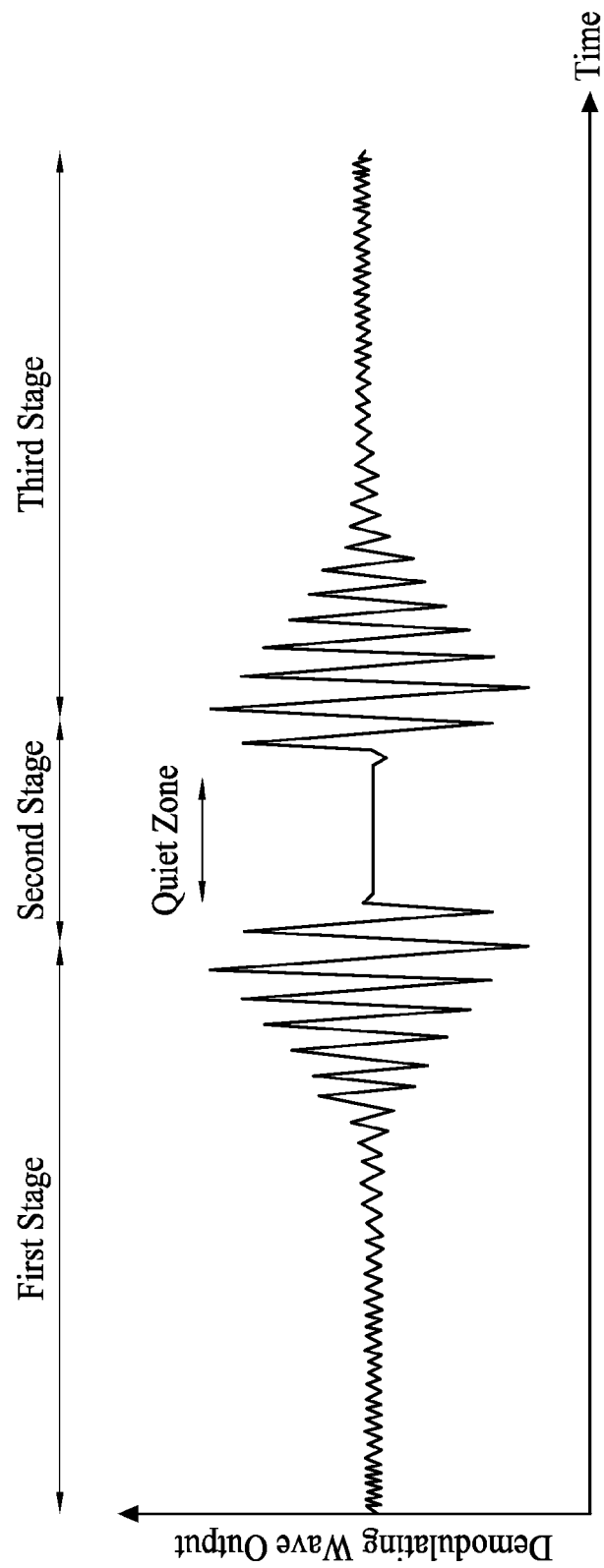
FIG. 2C is a graphical view of a demodulating wave diagram through a band-pass filter in accordance with an embodiment of the disclosure.

FIG. 2A is a frequency scanning diagram of an RF sensing circuit in accordance with an embodiment of the disclosure. FIG. 2B is the output frequency of a voltage-controlled oscillator 20 vs. time diagram during frequency scanning FIG. 2C is a demodulating wave diagram through a band-pass filter 40. In this embodiment, the scanning can be divided into three stages which are described below.

In FIG. 2A, at the first stage, the locking range gradually approaches the sensing signal frequency. In FIG. 2B, the output frequency of the voltage-controlled oscillator 20 is influenced by the sensing signal to generate modulation. In FIG. 2C, the amplitude of the demodulating wave through the band pass filter 40 will gradually increase from flat as the locking range gradually approaches the sensing signal, and has the maximum peak when it is close to the sensing signal.

In FIG. 2A, at the second stage, the sensing signal frequency is within the locking range. In FIG. 2B, the output frequency of the voltage-controlled oscillator 20 shows a linear variation relative to the analog scanning voltage $V_t$. In FIG. 2C, when the sensing signal is within the locking range, the demodulating wave through the band pass filter 40 is a quiet zone showing quiet.

In FIG. 2A, at the third stage, the locking range is away from the sensing signal frequency. In FIG. 2B, the output frequency of the voltage-controlled oscillator 20 is influenced by the sensing signal to generate modulation. In FIG. 2C, when the locking range is gradually moving away from the sensing signal, the demodulating wave through the band pass filter 40 has the maximum peak when it is close to the sensing signal, and become flat when the locking range is away from the sensing signal. Moreover, in FIG. 2C, the digital signal processor 53 can be used for judging whether the output is the quiet zone between two peaks or a flat output wave far from the locking range. Lastly, the frequency of the sensing signal can be judged by the relative position of the quiet zone in the scanning period, and the power of the sensing signal can be judged by the time length of the quiet zone, so as to achieve the RF sensing circuit of the disclosure.

Figure 3:
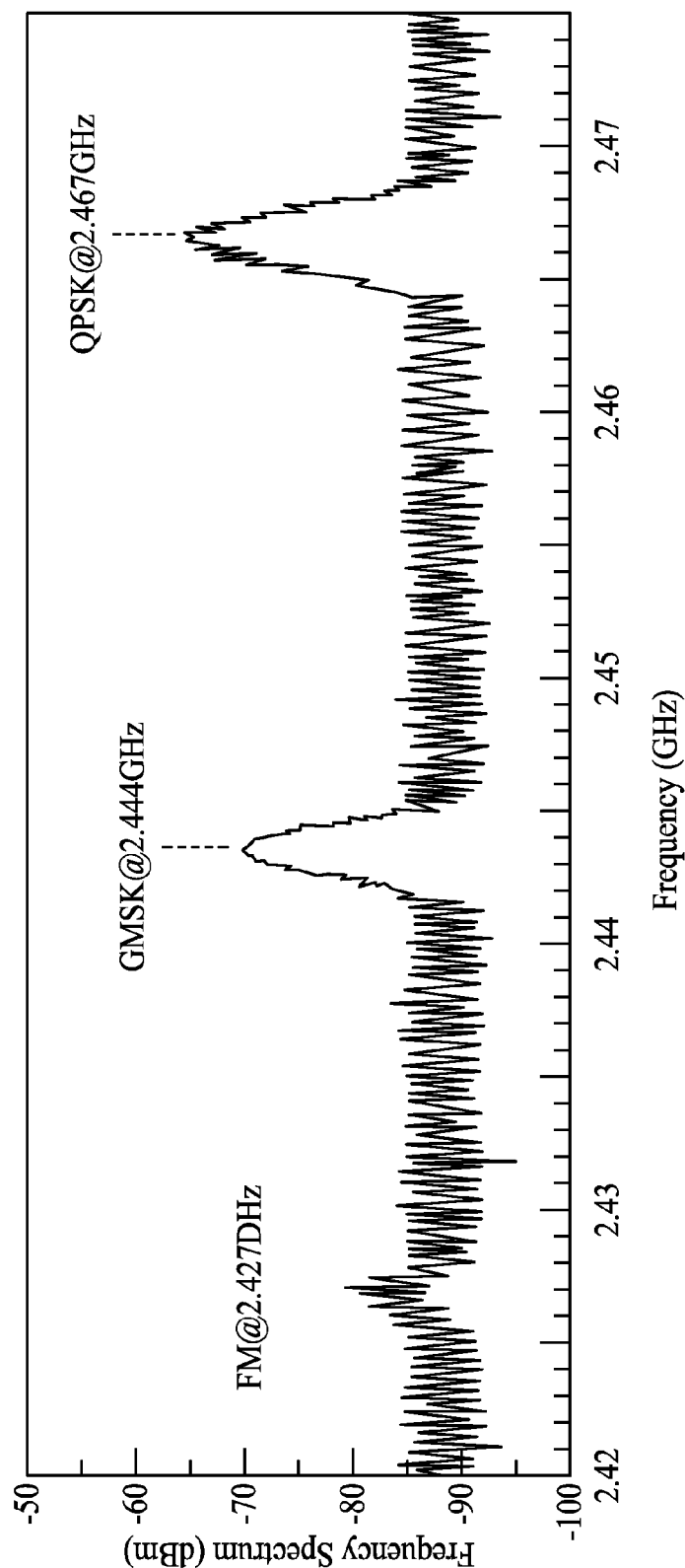
FIG. 3 shows a graphical view of the result of frequency spectrum scanning of the RF sensing circuit in accordance with an embodiment of the disclosure.
Figure 4:
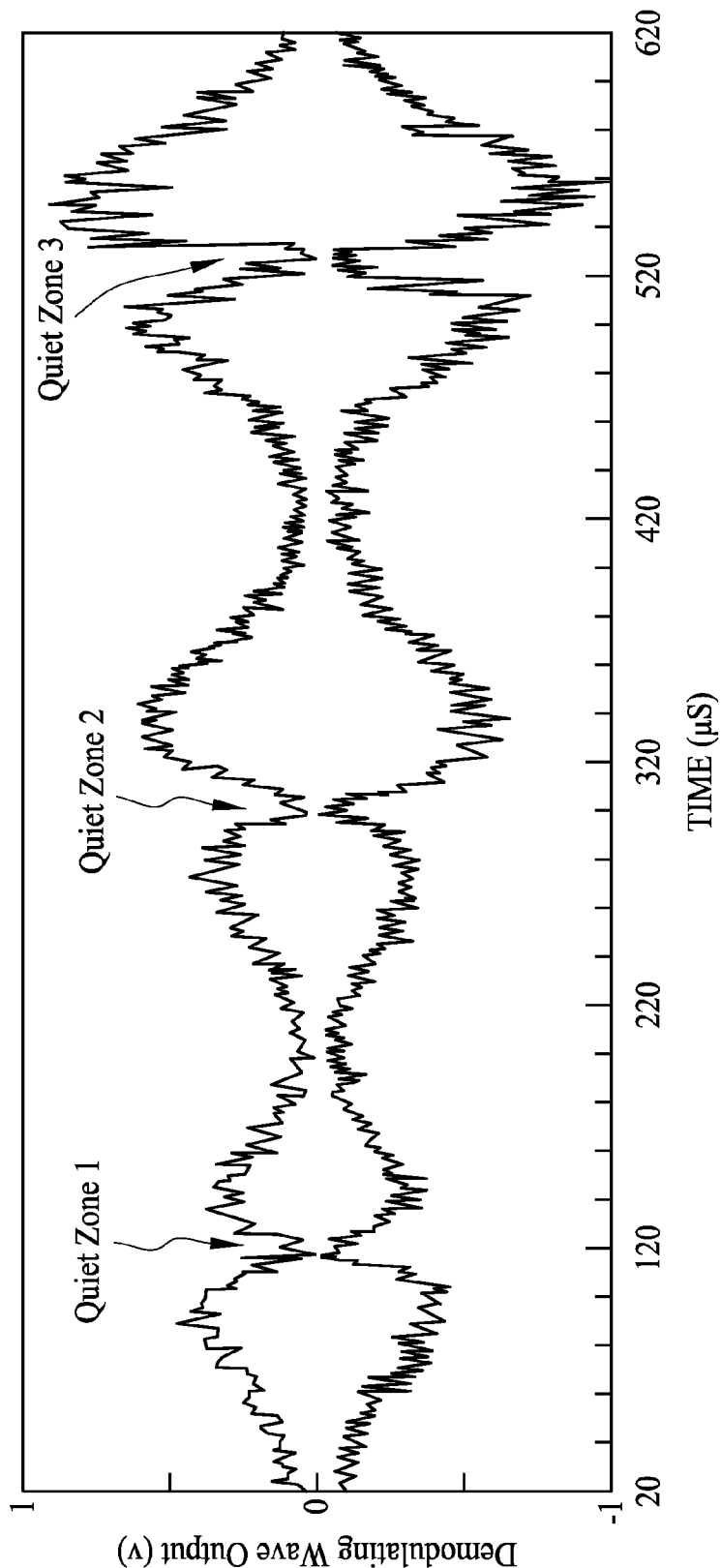
FIG. 4 shows a graphical view of the frequency demodulating wave diagram corresponding to FIG. 3 when the frequency spectrum scanning speed is larger than 100 MHz/msec in accordance with an embodiment of the disclosure.

FIG. 3 shows the result of frequency spectrum scanning of the RF sensing circuit in accordance with an embodiment of the disclosure. The signal distribution in the frequency spectrum shows that FM modulation signal is at 2.427 GHz (power is −80 dBm), GMSK modulation signal is at 2.444 GHz (power is −70 dBm) and QPSK modulation signal is at 2.467 GHz (power is −65 dBm). FIG. 4 shows the frequency demodulating wave diagram corresponding to FIG. 3 when the frequency spectrum scanning speed is larger than 100 MHz/msec in accordance with an embodiment of the disclosure. The wave diagram is subjected to digital signal process, and as a result three quiet zones can be identified. The frequencies and powers of the three sensing signals in the frequency spectrum can be calculated by the time positions and the time lengths of the three sensing signals.

In comparison with the RF sensing circuit of the prior art using the frequency synthesizer RF receiver as a sensing basis, the RF sensing circuit of the disclosure using injection locking and frequency demodulation as sensing bases can reduce the use of circuit devices, system complexity, and power consumption. In addition, the disclosure uses the non-synchronizing frequency demodulating unit 30 and the demodulating wave provided by the band pass filter 40 to obtain the frequency position and the power of the sensing signal. Therefore, it is not necessary to use the analog-to-digital converter 51 with high sampling rate, and the sensing sensitivity can be increased by the low noise amplifier 10 and the injection locking technologies. Moreover, the frequency synthesizer is not employed for the disclosure, so that the disclosure is not limited by the switching time, and the frequency spectrum scanning speed can be increased significantly.

The above-described embodiments of the disclosure are intended to be illustrative only. Numerous alternative embodiments may be devised by those skilled in the art without departing from the scope of the following claims.

We claim:

1. A radio frequency sensing circuit with a voltage-controlled oscillator, the radio frequency sensing circuit comprising:
   a low noise amplifier;
   a voltage-controlled oscillator having an injection signal input port and a voltage input port, wherein the injection signal input port is electrically connected to an output of the low noise amplifier;
   a non-synchronizing frequency demodulating unit electrically connected to an output of the voltage-controlled oscillator;
   a band-pass filter electrically connected to an output of the non-synchronizing frequency demodulating unit; and
   a digital signal processing unit electrically connected to an output of the band-pass filter and the voltage input port of the voltage-controlled oscillator.

2. The radio frequency sensing circuit of claim 1, wherein the non-synchronizing frequency demodulating unit comprises a mixer and a delay line, the mixer is electrically connected to the output of the voltage-controlled oscillator, and the delay line has two ends electrically connected to the mixer and the output of the voltage-controlled oscillator, respectively.

3. The radio frequency sensing circuit of claim 2, wherein the input of the non-synchronizing frequency demodulating unit is the output of the mixer.

4. The radio frequency sensing circuit of claim 1, further comprising a receiving antenna electrically connected to an input of the low noise amplifier.

5. The radio frequency sensing circuit of claim 1, wherein the digital signal processing unit comprises an analog-to-digital converter electrically connected to the output of the band pass filter.

6. The radio frequency sensing circuit of claim 5, wherein the digital signal processing unit comprises a digital-to-analog converter electrically connected to the voltage input port of the voltage-controlled oscillator.

7. The radio frequency sensing circuit of claim 6, wherein the digital signal processing unit comprises a digital signal processor electrically connected to the analog-to-digital converter and the digital-to-analog converter.

* * * * *